United States Patent [19]

Rodgers

[11] 4,162,444
[45] Jul. 24, 1979

[54] PEAK LEVEL DETECTOR
[75] Inventor: Gregg S. Rodgers, Indianapolis, Ind.
[73] Assignee: Tuscan Corporation, Indianapolis, Ind.
[21] Appl. No.: 813,811
[22] Filed: Jul. 8, 1977
[51] Int. Cl.² .................. G01R 19/16; H03K 5/20
[52] U.S. Cl. ..................... 324/103 P; 307/351; 324/119
[58] Field of Search ........... 324/103 P, 103 R, 123 R, 324/119; 307/351; 358/10

[56] References Cited
U.S. PATENT DOCUMENTS

| | | | |
|---|---|---|---|
| 2,946,013 | 7/1960 | Deighton | 324/103 P |
| 3,491,296 | 1/1970 | Fishman | 324/103 R |
| 3,548,307 | 12/1970 | Fathauer | 324/103 R |
| 3,694,748 | 9/1972 | Hekimian | 324/103 P |
| 3,712,989 | 1/1973 | Barton | 307/351 |
| 3,949,294 | 4/1976 | Imura | 324/103 P |
| 3,973,197 | 8/1976 | Meyer | 324/103 P |

Primary Examiner—Rudolph V. Rolinec
Assistant Examiner—Ernest F. Karlsen
Attorney, Agent, or Firm—Woodard, Weikart, Emhardt & Naughton

[57] ABSTRACT

A peak detector circuit to be used in conjunction with an RF tunable volt meter is disclosed which charges a capacitor to a voltage level proportional to the amplitude of an incoming signal and then provides an accurate output signal, for driving a meter, the value of this signal being proportional to the voltage on the capacitor. The accuracy of the meter indicator reading is virtually identical for a particular amplitude regardless of whether the incoming signal is modulated or unmodulated (CW).

17 Claims, 2 Drawing Figures

PEAK LEVEL DETECTOR

BACKGROUND OF THE INVENTION

1. Field of the Invention

This invention relates in general to detection circuits and in particular to peak voltage level detection circuits.

2. Description of the Prior Art

There are numerous prior art circuits whose function is to measure the level of an incoming signal. The techniques employed within such circuits to make such measurements are almost as numerous as the number of circuits. In many of these circuits, a capacitor is charged to a particular level and then this charge level is used to either trigger some other function, such as a warning of when a critical value is approaching, or for comparison to a later-received signal.

The type of devices in which such detection circuits are used controls the composition of the incoming signals which the detection circuit receives. Similarly, the particular application for the detection circuit governs the design details of the detection circuit. Following are some examples of the variations which exist in prior art detection circuits.

U.S. Pat. No. 3,548,307 issued to Fathauer discloses a circuit which is adapted for use with a variable input signal from a radar set. The circuit is used to capture a variable signal of short duration which can be held (by use of a push-button switch) thereby permitting a readable meter indication which would otherwise be too brief to accurately read.

U.S. Pat. No. 3,491,296 issued to Fishman requires that the incoming signals which are to be measured have a constant or slowly varying pulse amplitude.

U.S. Pat. No. 2,946,013 issued to Deighton relates to voltage-measuring circuits for measuring the amplitudes of voltage pulses of short duration. The circuit stores the voltage across a capacitor while the amplitude is compared with a known voltage.

U.S. Pat. No. 3,949,294 issued to Imura discloses a circuit with changeable time constant sections such that suitable rise and decay times are provided for indicating both the peak value of an audio signal and/or the resultant volume of the sound (VU indication).

U.S. Pat. No. 3,973,197 issued to Meyer discloses a circuit for detecting the positive and negative peaks of an analog signal by first converting the analog signal into a current digital signal and then comparing this signal to a previously developed and stored signal and exchanging signals to establish new stored signals.

U.S. Pat. No. 3,694,748 issued to Hekimian discloses a peak-to-peak detector circuit for measuring the voltage difference between positive and negative peaks of a signal.

Other patents which have come to my attention in connection with such detection circuits are as follows:

| Patent No. | Patentee | Issue Date |
| --- | --- | --- |
| 2,468,687 | Schmitt | 4/26/49 |
| 3,790,887 | Rich | 2/05/74 |
| 3,753,109 | Schainbaum | 8/14/73 |
| 3,259,760 | Morey et al. | 7/05/66 |
| 3,012,195 | Slocomb et al. | 12/05/61 |

Also known within the art is the use of a voltage comparator integrated circuit as part of a positive or negative peak detector circuit. A suitable integrated circuit for such use is an LM 311 available from National Semiconductor, Santa Clara, Calif.

Even with the wide variations in the prior art as to the type of circuits and their application, none of these prior art patent references disclose a circuit specifically designed to be used in conjunction with a tunable RF voltmeter or the like, which is intended for measuring signals which may be either modulated or unmodulated (CW) and to display the peak amplitude of such signals accurately, regardless of which type of carrier is present or which type of carrier was used to calibrate the deflection of a meter (used as the displaying means).

One object for any detection circuit design intended to measure a particular signal level is to be able to make such measurement accurately and with reliable repeatability. Past efforts in the design of tunable RF voltmeters have been unable to accurately and repeatedly indicate a level proportional to the peak amplitude of an incoming signal as this signal changed between a modulated and a CW (unmodulated) waveform. If the displaying meter was calibrated by a modulated signal, the measurement of a subsequent unmodulated signal would be subject to significant error.

SUMMARY OF THE INVENTION

One embodiment of the present invention might include a peak detector circuit which comprises means for linearly displaying on a display device the peak level of video modulated incoming signals as well as CW incoming signals received from a signal source which means includes a first peak detector means, second peak detector means and display driver means. The first peak detector means is coupled to the signal source and incorporates a full wave detector which provides a voltage on a first capacitor representative of peaks of the incoming signal. The second peak detector means is coupled to the first capacitor for measuring peaks thereon and provides a second capacitor with a larger time constant than the first capacitor. The display driver means linearly produces a signal which is proportional to the signal on the second capacitor.

One object of the present invention is to provide an improved peak detector circuit which is suitable for use with a tunable RF voltmeter.

Related objects and advantages of the present invention will be apparent from the following description.

DESCRIPTION OF THE PREFERRED EMBODIMENT

Figure 1:
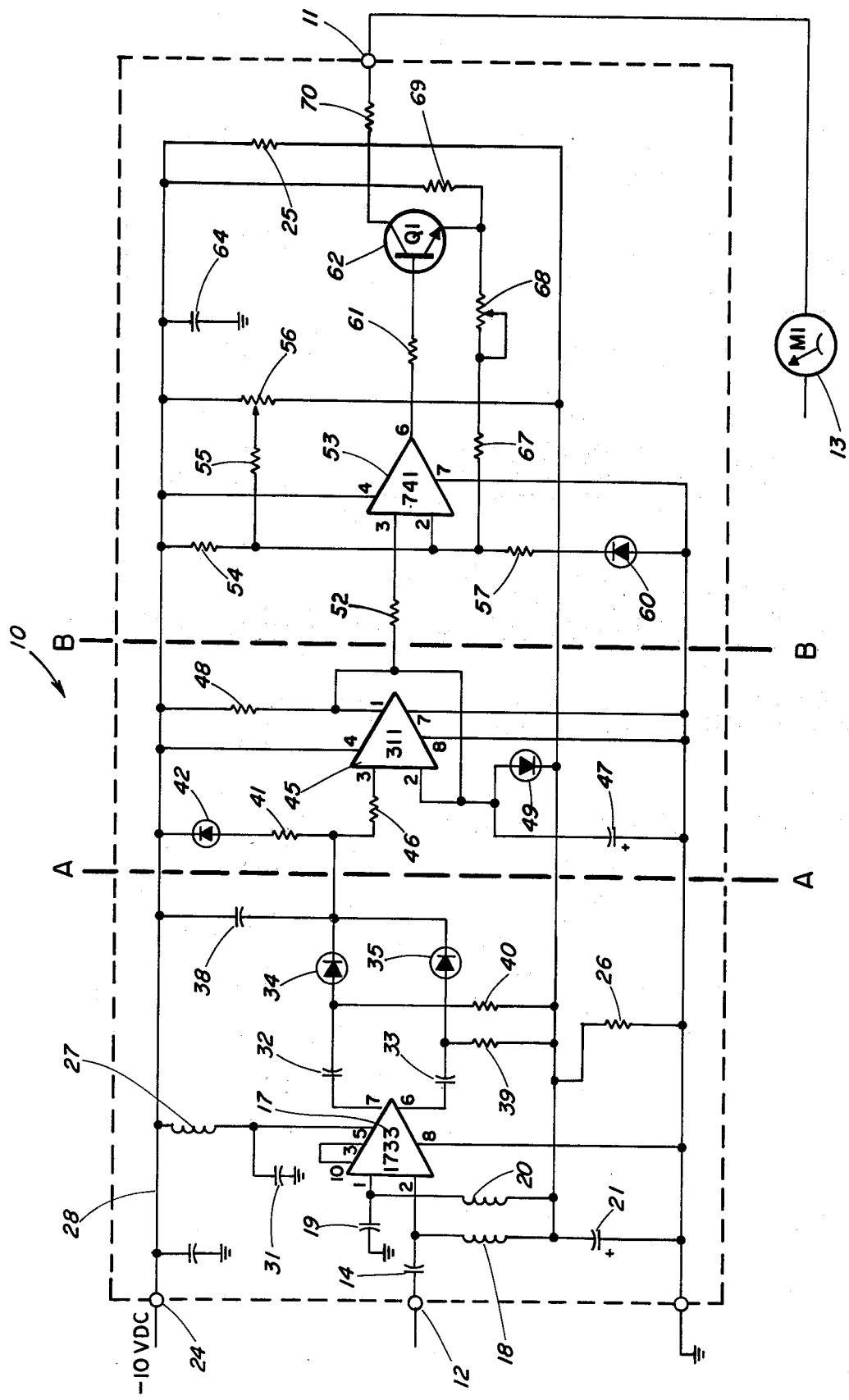
FIG. 1 is a circuit diagram of a peak detector circuit according to the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring to FIG. 1, there is illustrated a schematic diagram of a peak detector circuit 10 according to the present invention. The circuit 10 operates to provide an output signal at terminal point 11 which is proportional to the peak amplitude of an incoming signal received at terminal point 12. This type of circuit might be used in combination with a tunable RF voltmeter in which both CW (unmodulated) and modulated RF signals are present. In such devices, it is desirable to be able to accurately indicate the peak amplitude of such signals whether CW or modulated without having to recalibrate the display device. The display device may be, for example, meter 13 which is external to circuit 10 and connects to terminal point 11.

The incoming signal at terminal point 12 enters through capacitor 14 which filters out or blocks DC portions of the incoming signal. The signal out of capacitor 14 connects to one input (pin 2) of differential video amplifier 17. A suitable component for amplifier 17 is an LM 733 available from National Semiconductor; Santa Clara, Calif. The LM 733 is a two-stage, differential input, differential output, wide-band integrated circuit and certain pin numbers are indicated in FIG. 1. Inductor 18 is an RF choke and is used to supply bias to pin 2 of amplifier 17. Capacitor 19 which connects between ground and the differential input (pin 1) of amplifier 17 is used as a bypass capacitor and is necessary to give the differential input an RF ground reference. Inductor 20 serves a similar purpose to inductor 18, that being to supply bias to pin 1 of amplifier 17. Capacitor 21 is a bypass capacitor used to keep RF off of the negative 5 volt supply which is obtained by dividing in half, by means of resistors 25 and 26, the negative 10 volts, present at terminal 24. Pins 10 and 3 of amplifier 17 are external gain adjustments and are shorted together to give amplifier 17 an approximate gain of 100. Inductor 27 is an RF choke used to keep RF off of the negative 10 volt supply which is present at terminal point 24 and couples to other portions of circuit 10 through circuit line 28. Capacitor 31 is an RF bypass capacitor used to maintain pin 5 of amplifier 17 at an RF ground reference. Capacitors 32 and 33 are DC blocking capacitors which couple the differential output of amplifier 17 to diodes 34 and 35, respectively, which serve the function of detection and form a full wave detector. Capacitor 38 is used as an integrating capacitor and charges to a voltage level which corresponds to the peak detected level provided by diodes 34 and 35.

Resistors 39 and 40 bias up the input of both diodes 34 and 35 causing a small current to flow into resistor 41 and diode 42. The arrangement of, and current flow through, resistor 41 and diode 42 has several functions. First the arrangement provides good linearity from diodes 34 and 35, and secondly the arrangement provides the proper DC bias voltage required by voltage comparator 45. Diode 42 also serves as a means for temperature compensation. A suitable component for voltage comparator 45 is an LM 311 available from National Semiconductor. Some of the pin numbers have been indicated in FIG. 1 to aid in an understanding of the circuit. A resistor 46 is used to protect the input to pin 3 of comparator 45. Capacitor 47 functions as a holding capacitor and is charged to a peak level proportional to the peak voltage level entering comparator 45. Capacitor 47 has a large time constant such that once a peak level is sensed, the capacitor will be charged to a proportional level and will decay slowly. Thus capacitor 47 can actually be thought of as holding this peak level charge. Resistor 48 is a DC return for the emitter of an output transistor which is part of the internal circuitry of comparator 45. Diode 49 is used to limit the maximum DC potential of pins 1 and 2 to approximately a negative 4.4 volts. This limiting is necessary due to the fact with initial turn on of the system with which peak detector circuit 10 is used, the negative terminal of capacitor 47 must charge to about a negative 5.0 volts before the output transistor within the circuitry of voltage comparator 45 becomes functional. Diode 49 charges capacitor 47 to this negative 4.4 volts very rapidly, then resistor 48 continues charging capacitor 47 up to the negative 5.0 volt level. At this point, diode 49 is reverse biased and no longer plays an active role in the circuit. A resistor 52 is used to protect the input to pin 3 of operational amplifier 53. A suitable component for operational amplifier 53 is an LM 741 available from National Semiconductor. The characteristics of amplifier 53 are such that a very high input impedance is obtained in addition to a low output impedance and excellent gain stability. Certain pin numbers have been indicated to aid in an understanding of the circuit.

The entire arrangement of resistors 54, 55, 56 and 57 is used to bias operational amplifier 53 such that when there is no input signal to operational amplifier 53, no deflection will occur on meter 13. The adjustable nature of this arrangement is by means of variable resistor 56 which is used as DC offset adjustment means for calibrating the scale deflection of meter 13. Diode 60 couples to resistor 57 and to the common ground and is used for temperature compensation. Resistor 61 which couples the base terminal of transistor 62 to pin 6 of amplifier 53 is used to protect the base of transistor 62. Capacitor 64 which connects between circuit line 28 (at a negative 10 volt potential) and ground reference is used as an RF bypass capacitor.

Resistor 67 and variable resistor 68 which couple between the emitter terminal of transistor 62 and pin 2 of operational amplifier 53 are used as feedback resistors to provide gain stability to amplifier 53 and transistor 62. Variable resistor 68 is used as gain adjustment means for setting the gain of amplifier 53. Resistor 69 connects between the emitter terminal of transistor 62 and the −10 volt supply line. Resistor 69 is an emitter return resistor and together with resistor 70, the collector terminal resistor, limits the maximum current to the meter 13. Transistor 62 is necessary to transform the voltage at pin 6 of amplifier 53 to a suitable value for driving meter 13.

Figure 2:
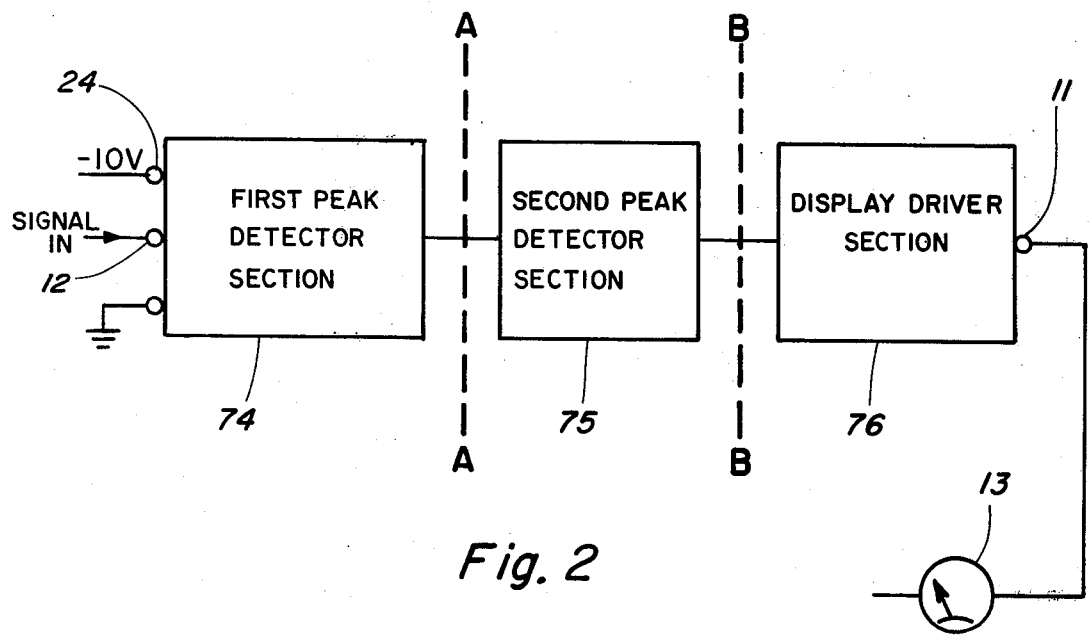
FIG. 2 is a block diagram of the FIG. 1 circuit diagram.

Although the details of the circuit components have been described and discussed, it is helpful to visualize this peak detector circuit 10 by means of functional blocks and to describe in broader functional language what occurs within each block. The circuit of FIG. 1 can be conveniently divided into three functional blocks by separating the circuit along lines A—A and B—B. These three blocks are shown in FIG. 2. The three blocks have been identified as a first peak detector section 74, a second peak detector section 75 and a display driver section 76. For purposes of clarity, common lines connecting these three sections to each other, such as the negative 10 volt circuit line 28, have been omitted. The only connecting line is that line carrying actual input signals to the integrated circuits 17, 45 and 53 of each section, respectively. A typical incoming signal to terminal point 12, whether a CW signal or a modulated video signal has a peak-to-peak voltage level of only a small fraction of one volt and a frequency of approximately 52 MHz. Such is a common signal associated with the use of a tunable RF volt meter such as a Model 7270 manufactured by Texscan Corporation of Indianapolis, Ind.

Capacitor 38 (see FIG. 1) has a time constant which is sufficiently short to allow capacitor 38 to rapidly charge to a voltage level representative of the peaks of the incoming signal. However, although capacitor 38 charges rapidly, it will also decay somewhat quickly such that noise spikes will not result in the production of an inaccurate peak level indication. The relationship between the frequency of the incoming signal and the rate of decay of the capacitor basically determines the signal waveform leaving the first peak detector section 74 and entering the second peak detector section 75. The amplitude of this signal waveform is governed by the gain of differential video amplifier 17.

The second peak detector section 75 functions in much the same fashion as described for the first peak detector section 74 with respect to the charging of the capacitor to a level which is representative of the peak voltage level of the incoming signal to section 75. Initially, voltage comparator 45, resistor 48 and diode 49 control the charging of capacitor 47 up to a negative 5.0 volt level as previously described. Continued charging of capacitor 47 up to the voltage level of the signal input to pin 3 of comparator 45 is controlled by the nature of the circuitry within comparator 45 and the feedback branch from pin 1 to pin 2. Inasmuch as comparator 45 does not provide amplification, the signal level at pin 1 will continue to charge capacitor 47 until the charge on capacitor 47 equals the signal level at pin 1. Then the feedback branch will bypass capacitor 47 and couple to pin 2. Capacitor 47 decays at a slow rate such that a constant level input (typical of a CW waveform) at pin 2 or a frequently repeating peak level (typical of a modulated waveform) will be able to hold capacitor 47 at a somewhat constant charge level.

A CW signal at terminal point 12 will result in a corresponding waveform entering peak detector section 75 while a modulated signal at terminal point 12 will result in a slightly different waveform. However, the signals which leave second peak detector sections 75 and enter the display driver section 76 are of a constant voltage (straight line signal level) which is proportional to the peak amplitude of the incoming signal at terminal point 12 regardless of whether the signal is a CW or modulated signal. The nature of second peak detector section 75 will thus permit meter 13 to yield an accurate reading, proportional to the peak level, present at terminal point 12, of a CW signal as well as a modulated signal and the degree of accuracy and sensitivity of meter 13 is not dependent upon the nature of the signal carrier. Once the meter scale has been calibrated by either a CW or a modulated signal to provide a certain deflection in response to particular peak signal level, the meter will continue to accurately deflect to a degree indicative of the signal level being received regardless of how rapidly or how frequently the carrier waveform of the incoming signal changes.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A peak detector circuit which comprises means for linearly displaying, on a display device, the peak level of video modulated, incoming signals as well as CW incoming signals received from a signal source which means includes:
   (a) first peak detector means coupled to said signal source and incorporating a full wave detector providing a voltage on a first capacitor representative of peaks of said incoming signal;
   (b) second peak detector means coupled to said first capacitor for measuring peaks thereon and providing a second capacitor with a larger time constant than the first capacitor; and
   (c) display driver means for linearly producing a signal proportional to the signal on said second capacitor.

2. The peak detector circuit of claim 1 in which said first peak detector means includes a differential video amplifier.

3. The peak detector circuit of claim 1 in which said second peak detector means includes a voltage comparator.

4. The peak detector circuit of claim 1 in which said display driver means includes an operational amplifier.

5. The peak detector circuit of claim 3 in which said second peak detector means further includes feedback means connected across said comparator, said feedback means being operable to couple said second capacitor to said comparator for charging said second capacitor to a peak level.

6. The peak detector circuit of claim 4 in which said display driver means further includes a transistor the base terminal of which is coupled to the output of said operational amplifier.

7. The peak detector circuit of claim 4 in which said display driver means further includes gain adjustment means for setting the gain of said operational amplifier.

8. The peak detector circuit of claim 4 in which said second peak detector means includes a voltage comparator.

9. The peak detector circuit of claim 8 in which said first peak detector means includes a differential video amplifier.

10. The peak detector circuit of claim 9 in which said second peak detector means further includes feedback means connected across said comparator, said feedback means being operable to couple said second capacitor to said comparator for charging said second capacitor to a peak level.

11. The peak detector circuit of claim 10 in which said display driver means further includes a transistor, the base terminal of which is coupled to the output of said operational amplifier.

12. The peak detector circuit of claim 11 in which said display driver means further includes gain adjustment means for setting the gain of said operational amplifier.

13. The peak detector circuit of claim 12 in which said display device is a meter and said display driver means further includes DC offset adjustment means for calibrating the scale deflection of said meter.

14. The peak detector circuit of claim 13 in which said meter couples to the collector of said transistor.

15. The peak detector circuit of claim 1 wherein said first peak detector means is arranged to have a rapid response time and a rapid decay time and said second peak detector means is arranged to have a rapid response time and a slow decay time.

16. The peak detector circuit of claim 15 wherein one side of said second capacitor is continuously connected to a ground potential.

17. The peak detector circuit of claim 1 wherein one side of said second capacitor is continuously connected to a ground potential.

* * * * *

UNITED STATES PATENT AND TRADEMARK OFFICE
CERTIFICATE OF CORRECTION

PATENT NO. :  4,162,444
DATED      :  July 24, 1979
INVENTOR(S) : Gregg S. Rodgers It is certified that error appears in the above-identified patent and that said Letters Patent are hereby corrected as shown below:

On the face of the patent the assignee's company name is shown as "Tuscan" as opposed to --Texscan-- the correct spelling of the corporate name.

Signed and Sealed this

Thirteenth Day of November 1979

[SEAL]

Attest:

RUTH C. MASON
Attesting Officer

LUTRELLE F. PARKER
Acting Commissioner of Patents and Trademarks